United States Patent
Dai (10) Patent No.: US 9,704,884 B2
(45) Date of Patent: Jul. 11, 2017

(54) LOW TEMPERATURE POLY-SILICON (LTPS) THIN FILM TRANSISTOR BASED LIQUID CRYSTAL DISPLAY

(71) Applicant: Shenzhen China Star Optoelectrics Technology Co., Ltd., Shenzhen, Guangdong (CN)

(72) Inventor: Tianming Dai, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 169 days.

(21) Appl. No.: 14/436,063

(22) PCT Filed: Jan. 21, 2015

(86) PCT No.: PCT/CN2015/071208
§ 371 (c)(1),
(2) Date: Apr. 15, 2015

(87) PCT Pub. No.: WO2016/106899
PCT Pub. Date: Jul. 7, 2016

(65) Prior Publication Data
US 2016/0351595 A1 Dec. 1, 2016

(30) Foreign Application Priority Data
Dec. 31, 2014 (CN) .......................... 2014 1 0854124

(51) Int. Cl.
*H01L 27/12* (2006.01)
*G02F 1/1343* (2006.01)
(Continued)

(52) U.S. Cl.
CPC ........ *H01L 27/1222* (2013.01); *G02F 1/1368* (2013.01); *G02F 1/13439* (2013.01);
(Continued)

(58) Field of Classification Search
CPC . H01L 51/56; H01L 27/3244; H01L 27/3248; H01L 51/523
(Continued)

(56) References Cited

U.S. PATENT DOCUMENTS

2006/0290871 A1* 12/2006 Harada ................. G02F 1/1337
349/153
2015/0311232 A1* 10/2015 Sun .................... G02F 1/136227
257/72
2016/0247821 A1* 8/2016 Li ..................... H01L 29/78642

* cited by examiner

*Primary Examiner* — Evan Pert
*Assistant Examiner* — Changhyun Yi
(74) *Attorney, Agent, or Firm* — Andrew C. Cheng (57) ABSTRACT

An array substrate comprises a substrate, a common electrode formed on the substrate, a light shielding layer disposed on the common electrode, an insulating layer disposed on the light shielding layer and the common electrode, a poly-silicon layer, a gate insulating layer, a gate connected with the common electrode by a hole, a medium layer and a source drain. A method for manufacturing the array substrate comprises forming a transparent conductive layer and a first metallic layer on the substrate, forming patterned common electrode and light shielding layer by multiple steps of etching so that a process of photomask can be saved, and forming holes connecting with the common electrode and the gate by a photomask etching process, then manufacturing a medium layer and a source drain. The method adopts seven processes of photomask so that the process is simplified, and the cost is lowered.

6 Claims, 10 Drawing Sheets

(51) Int. Cl.
   *G02F 1/1368* (2006.01)
   *H01L 21/311* (2006.01)
   *H01L 21/027* (2006.01)
   *H01L 21/3213* (2006.01)
   *H01L 21/02* (2006.01)
   *G02F 1/1335* (2006.01)
   *H01L 29/786* (2006.01)
   *H01L 21/77* (2017.01)
   *G02F 1/1362* (2006.01)

(52) U.S. Cl.
   CPC .. *G02F 1/133512* (2013.01); *G02F 1/134309* (2013.01); *H01L 21/0273* (2013.01); *H01L 21/02532* (2013.01); *H01L 21/02595* (2013.01); *H01L 21/31116* (2013.01); *H01L 21/32133* (2013.01); *H01L 21/77* (2013.01); *H01L 27/12* (2013.01); *H01L 27/1288* (2013.01); *H01L 29/78675* (2013.01); *G02F 1/136227* (2013.01); *G02F 2001/13625* (2013.01); *G02F 2001/134318* (2013.01); *G02F 2001/136231* (2013.01); *G02F 2001/136295* (2013.01); *G02F 2201/121* (2013.01); *G02F 2202/104* (2013.01)

(58) Field of Classification Search
   USPC ...... 257/72, E27.113, 51, E27.111, E21.413, 257/E29.293; 313/500
   See application file for complete search history.

LOW TEMPERATURE POLY-SILICON (LTPS) THIN FILM TRANSISTOR BASED LIQUID CRYSTAL DISPLAY

CROSS REFERENCE TO RELATED APPLICATION

This application claims the benefit of, and priority to, Chinese Patent Application No. 201410854124.6, filed Dec. 31, 2014, titled "ARRAY SUBSTRATE AND METHOD FOR MANUFACTURING THE SAME", the entire contents of which are incorporated by reference herein in its entirety.

BACKGROUND OF THE INVENTION

1. Field of the Invention

The disclosure is related to the field of the manufacture of LTPS thin film transistors, and more particularly, to an array substrate and method for manufacturing the same.

2. Description of Related Art

Low temperature poly-silicon (LTPS) thin film transistor liquid crystal display is different from the traditional amorphous silicon thin film transistor liquid crystal display. The electron mobility can be greater than 200 cm2N-sec, so that the area of the thin film transistor unit can be decreased, and the aperture ratio can also be increased. The energy consumption can also be decreased while increasing the lightness of the display. In addition, the greater electron mobility can integrate part of the driving circuit on the glass substrate, so that the number of the driving IC is decreased while the reliability of the liquid crystal display panel in significantly increased. Thus, LTPS thin film transistor liquid crystal display has become more and more popular. The LTPS thin film transistor liquid crystal display comprises an array substrate and a color film substrate disposed opposite to the array substrate.

However, currently there are nine processes in the manufacture of LTPS array substrate. As compared with the manufacture of amorphous silicon, the process needs larger scales of equipment, and the yield is too low. In addition, the cost of the process would be increased because of the complicated process, so that it is important to decrease the amount of the processes for LTPS mask in the field of LTPS.

SUMMARY OF THE INVENTION

The disclosure relates to an array substrate and method for manufacturing the same, which can simplify the manufacturing process and lower the cost.

According to an embodiment of the disclosure, an array substrate is provided. The array substrate comprises a substrate, a common electrode, a light shielding layer, an insulating layer, a poly-silicon layer, a gate insulating layer, a gate, a medium layer and a source drain. The common electrode is formed on the substrate, the light shielding layer is disposed on the common electrode, the insulating layer is disposed on the light shielding layer and the common electrode, and the gate is connected with the common electrode by a hole.

In one embodiment, the poly-silicon layer comprises a first poly-silicon section and a second poly-silicon section. The poly-silicon layer is disposed on the insulating layer, and the gate insulating layer is disposed on the poly-silicon layer and the insulating layer.

In one embodiment, the gate is disposed on the gate insulating layer. The orthographic projection of the gate is on the first poly-silicon section and the second poly-silicon section, and the medium layer is disposed on the gate and the gate insulating layer.

In one embodiment, the array substrate further comprises a first doping section and a second doping section. The first doping section and the second doping section are at the same layer with the first poly-silicon section and the second poly-silicon section. The source drain on the medium layer corresponds to the first poly-silicon section and the second poly-silicon section, and all the source drains connect with the first doping section and the second doping section through the hole.

According to another embodiment of the disclosure, a method for manufacturing an array substrate is provided. The method comprises:

providing a substrate, and depositing for forming a transparent conductive layer and a first metallic layer on the substrate in sequence;

forming a photoresist layer on the first metallic layer, patterning the photoresist layer by a photomask, so that the patterned photoresist layer comprising two first sections and two second sections, wherein the thickness of the first sections is greater than the thickness of the second sections;

patterning the transparent conductive layer and the first metallic layer by two etching processes for forming a common electrode and a light shielding layer, wherein the light shielding layer comprises a first light shielding section, a second light shielding section and an edge section, the first light shielding section, the second light shielding section and the edge section are disposed apart by an interval in the same layer, the orthographic projection of the edge section is at the common electrode, the orthographic projection of the second section is at the edge section, and the orthographic projections of the two first sections are at the first light shielding section and the second light shielding section;

removing the patterned photoresist layer and the edge section on the common electrode by two etching processes;

forming an insulating layer on the light shielding layer and the common electrode;

forming a patterned poly-silicon layer on the insulating layer, wherein the poly-silicon layer comprises a first poly-silicon section and a second poly-silicon section, the orthographic projection of the first poly-silicon section is at the first light shielding section, and the orthographic projection of the second poly-silicon layer is at the second light shielding layer;

forming a gate insulating layer on the poly-silicon layer and the insulating layer, forming a hole on the gate insulating layer by a photomask and an etching process and defining a first doping section, wherein the hole passes through the gate insulating layer and the insulating layer and the hole exposes the common electrode, and the first doping section is disposed at the two lateral sides of the first poly-silicon section;

injecting a first type ion to the first doping section; and forming a second metallic layer at the gate insulating layer, patterning the second metallic layer for forming a gate, and the gate connecting with the common electrode through the hole.

In one embodiment, the method for manufacturing an array substrate further comprises: defining a second doping section and injecting a second ion to the second doping section, wherein the second doping section is disposed at the two lateral sides of the second poly-silicon section;

forming a medium layer on the gate and the gate insulating layer, and forming a source drain layer on the medium layer;

patterning the source drain layer by a photomask etching process for forming a source drain corresponding to the first poly-silicon section and a source drain corresponding to the second poly-silicon section, wherein the source drain connects with the first doping section and the second doping section by the hole, respectively; and forming a patterned pixel layer on the source drain and the medium layer.

In one embodiment, the step of patterning the transparent conductive layer and the first metallic layer by two etching processes for forming a common electrode and a light shielding layer comprises: etching the first metallic layer exposed between two first sections and between one first section and one second section for forming the first light shielding section, the second light shielding section and the edge section of the light shielding layer; and wet etching the transparent conductive layer exposing from the light shielding layer for forming the common electrode.

In one embodiment, the step of removing the light shielding layer and the edge section on the common electrode by an etching process comprises: after removing the second section and part of the first section by dry etching, removing the rest part of the first section and the edge section at the common electrode by a dry etching process.

In one embodiment, the step of forming a hole on the gate insulating layer by a photomask and an etching process and defining a first doping section comprises: forming the patterned photoresist layer on the gate insulating layer by a semipermeable membrane photomask for forming an electrode hole and two implanting holes;

dry etching the gate insulating layer and the insulating layer corresponding to the electrode hole for forming the hole; and removing part of the photoresist layer and penetrating the two implanting holes by etching for forming two implanting holes connecting with the gate insulating layer, and the positions of the two implanting holes corresponding to the first doping section.

In one embodiment, the first type ion is a P type ion, the second type ion is an N type ion, alternatively, the second type ion is a P type ion, and the first type ion is an N type ion.

According to the embodiment of the disclosure, the method for manufacturing an array substrate comprises forming a transparent conductive layer and a first metallic layer on the substrate, then forming patterned common electrode and light shielding layer by multiple steps of etching, so that a process of photomask can be saved; then forming holes connecting with the common electrode and the gate by a photomask etching process, then manufacturing a medium layer and a source drain, so that a passivation layer is saved. The whole method adopts seven processes of photomask, so that the process of the array substrate tube is simplified, and the cost of manufacturing the array substrate is lowered.

BRIEF DESCRIPTION OF THE DRAWINGS

The above and other exemplary aspects, features and advantages of certain exemplary embodiments of the present disclosure will be more apparent from the following description taken in conjunction with the accompanying drawings, in which.

DETAILED DESCRIPTION OF THE PREFERRED EMBODIMENTS

The following description with reference to the accompanying drawings is provided to clearly and completely explain the exemplary embodiments of the disclosure. It is apparent that the following embodiments are merely some embodiments of the disclosure rather than all embodiments of the disclosure. According to the embodiments in the disclosure, all the other embodiments attainable by those skilled in the art without creative endeavor belong to the protection scope of the disclosure.

Figure 1:
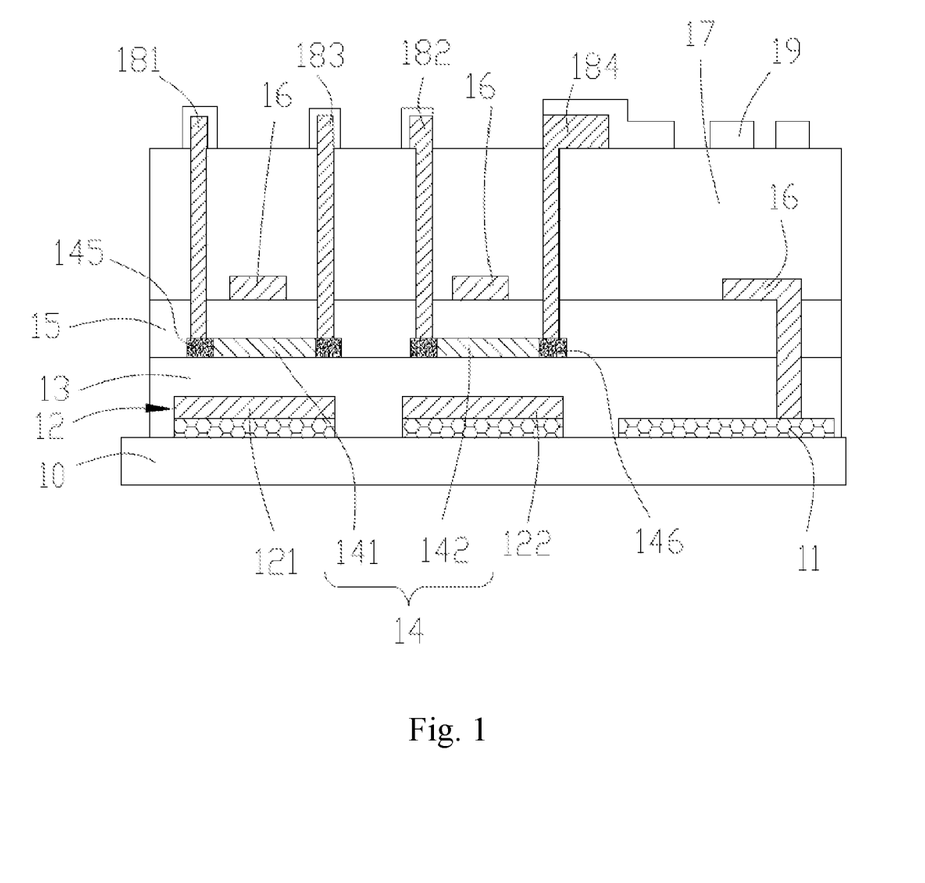
FIG. 1 is a sectional view of an array substrate according to a preferred embodiment of the disclosure.

Please refer to FIG. 1, an array substrate in a LTPS thin film transistor display is provided. The array substrate comprises a substrate, a common electrode 11, a light shielding layer 12, an insulating layer 13, a poly-silicon layer 14, a gate insulating layer 15, a gate 16, a medium layer 17 and a source drain. The common electrode 11 is formed on the substrate 10, the light shielding layer 12 is disposed on the common electrode 11, and the insulating layer 13 is disposed on the light shielding layer 12 and the common electrode 11. According to the embodiment of the disclosure, the source drain further comprises a pixel layer 19. According to the embodiment of the disclosure, the array substrate comprises a PTFT and a NTFT, but the disclosure is not limited thereto. The source drain is source 181, 182 and drain 183, 184, respectively.

According to the embodiment of the disclosure, the poly-silicon layer 14 comprises a first poly-silicon section 141 and a second poly-silicon section 142. The poly-silicon layer 14 is disposed on the insulating layer 13, and the gate insulating layer 15 is disposed on the poly-silicon layer 14 and the insulating layer 13.

According to the embodiment of the disclosure, the gate 16 is disposed on the gate insulating layer 15. The orthographic projection of the gate 16 is on the first poly-silicon section and the second poly-silicon section, and the medium layer 17 is disposed on the gate 16 and the gate insulating layer 15.

According to the embodiment of the disclosure, the array substrate further comprises a first doping section 145 and a second doping section 146. The first doping section 145 and the second doping section 146 are at the same layer with the first poly-silicon section and the second poly-silicon section. The source drain on the medium layer 17 corresponds to the first poly-silicon section and the second poly-silicon section, and all the source drains connect with the first doping section 145 and the second doping section 146 through the hole.

Figure 2:
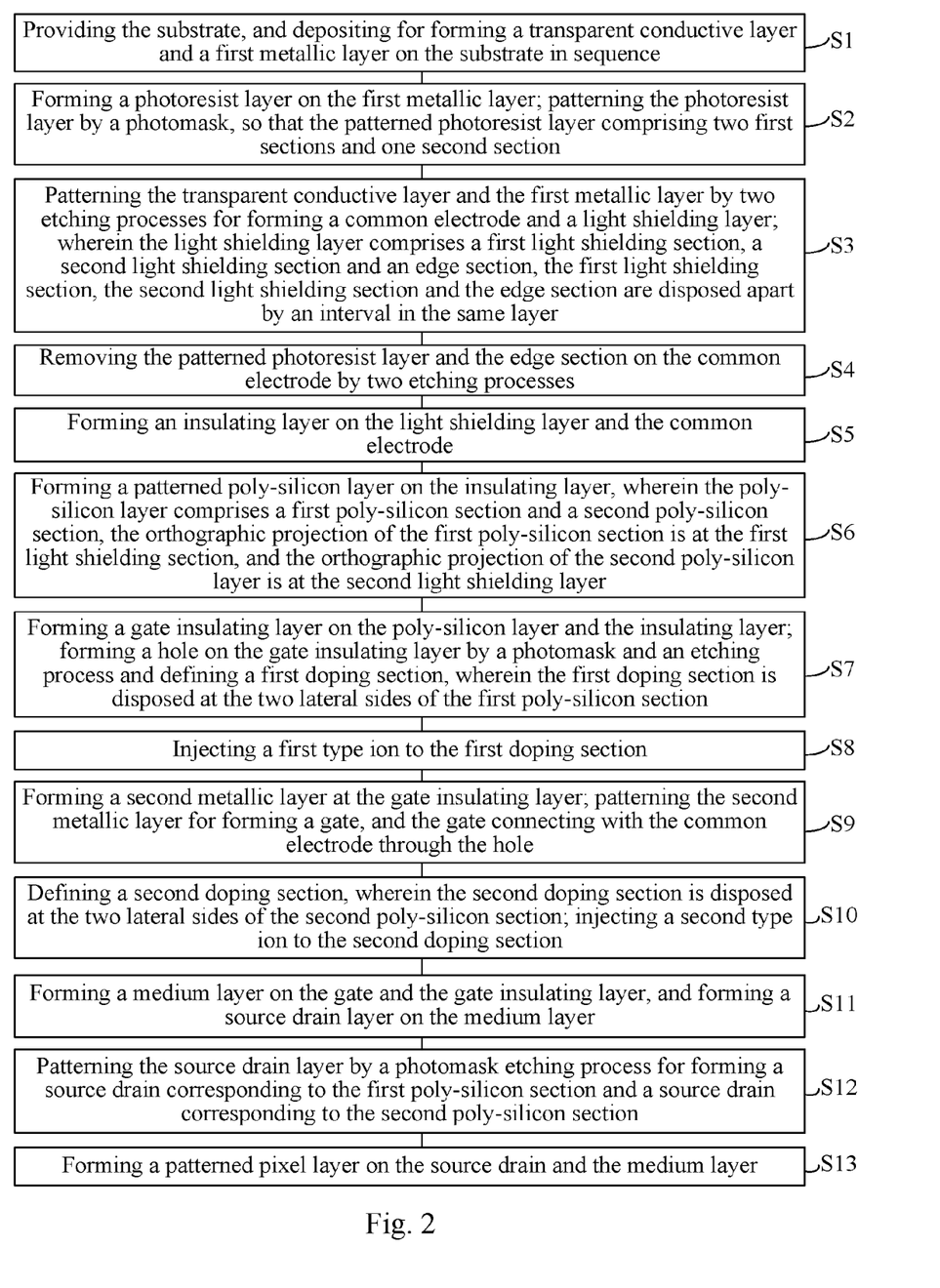
FIG. 2 is a flow chart of a method for manufacturing an array substrate according to a preferred embodiment of the disclosure.
Figure 3:
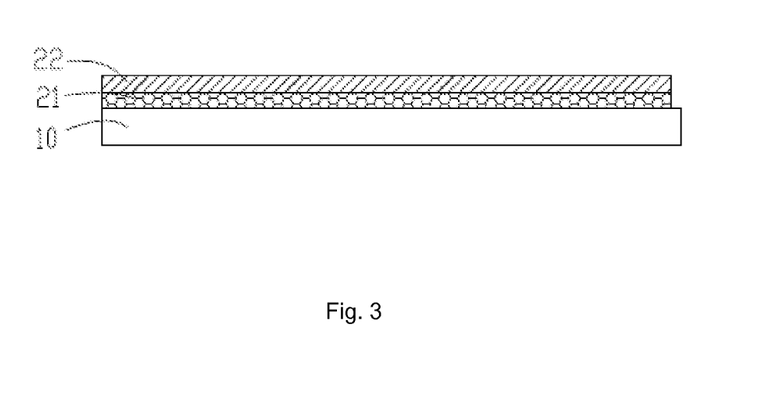
FIGS. 3-17 are sectional views of the array substrate in each step according to a preferred embodiment of the disclosure.

Please refer to FIG. 2, which is a flow chart of a method for manufacturing an array substrate according to a preferred embodiment of the disclosure. The method for manufacturing an array substrate comprises the following steps:

Please refer to FIG. 3, step S1, providing the substrate 10, and depositing for forming a transparent conductive layer 21 and a first metallic layer 22 on the substrate 10 in sequence. In this embodiment, the substrate 10 is, but not limited to, a glass layer.

Figure 4:
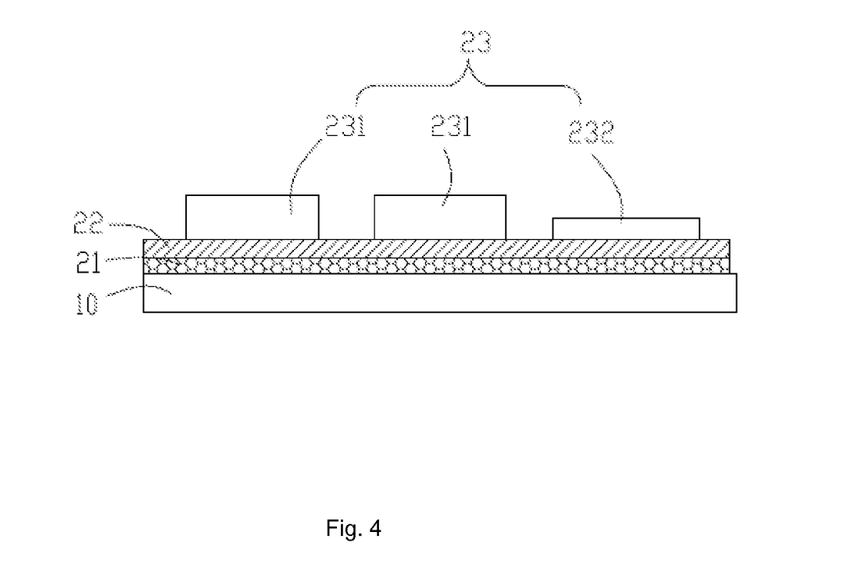

Please refer to FIG. 4, step S2, forming a photoresist layer on the first metallic layer 21, patterning the photoresist layer by a photomask, so that the patterned photoresist layer 23 comprising two first sections 231 and one second section 232. Wherein, the thickness of the first sections 231 is greater than the thickness of the second section 232. The photomask (not shown) comprises three transmitting section, semi transmitting section and shielding section disposed above the photoresist layer. The two first sections 231 and the second section 232 are formed by the irradiation of light. In this step, a first process of photomask is used. The technical of photomask is common in the technical field, so that it is not described in the description.

Figure 5:
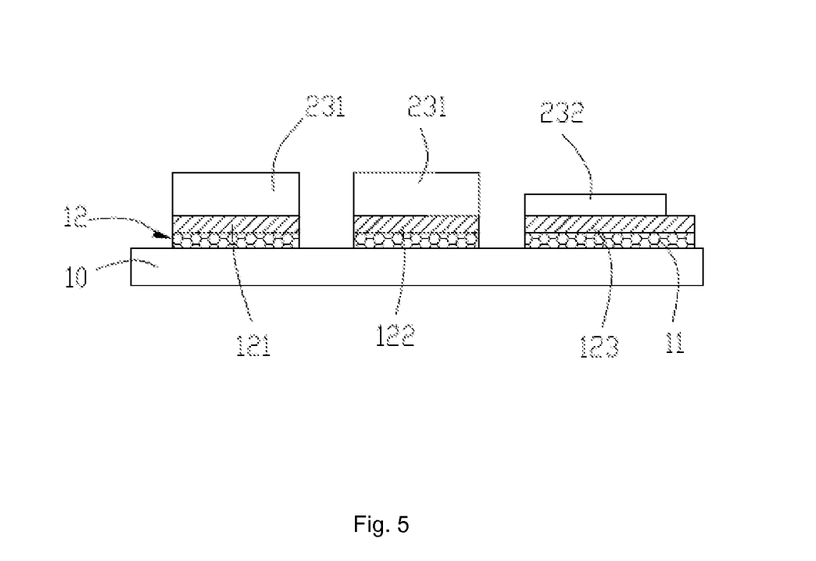

Please refer to FIG. 5, step S3, patterning the transparent conductive layer 21 and the first metallic layer 22 by two etching processes for forming a common electrode 11 and a light shielding layer 12; wherein the light shielding layer 12 comprises a first light shielding section 121, a second light shielding section 122 and an edge section 123, the first light shielding section 121, the second light shielding section and the edge section 123 are disposed apart by an interval in the same layer. The orthographic projection of the edge section 123 is at the common electrode 11, the orthographic projection of the second section 232 is at the edge section 123, and the orthographic projections of the two first sections 231 are at the first light shielding section 121 and the second light shielding section 122.

This step further comprises step S31, etching the first metallic layer 22 exposed between two first sections 231 and between one first section 231 and one second section 232 for forming the first light shielding section 121, the second light shielding section 122 and the edge section 123 of the light shielding layer 12.

Step S32, wet etching the transparent conductive layer 32 exposing from the light shielding layer 23 for forming the common electrode 11.

In this embodiment, the gas used for etching is CF4, SF6 or the mixture of Cl2 and O2, and the etching solution is oxalic acid, sulfuric acid, hydrochloric acid, or the mixture of oxalic acid, sulfuric acid and hydrochloric acid.

Figure 6:
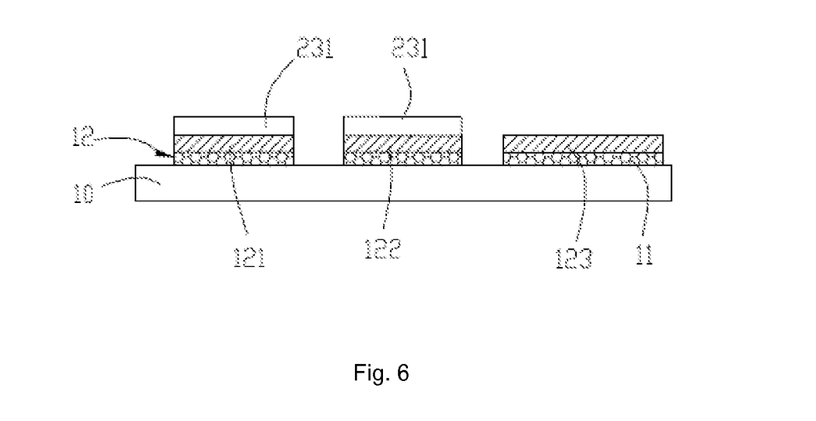
Figure 7:
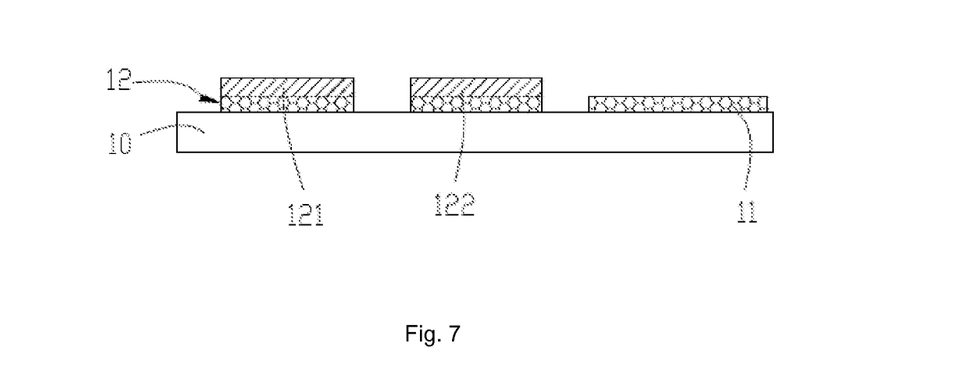

Please refer to FIG. 6 and FIG. 7, step S4, removing the patterned photoresist layer 23 and the edge section 123 on the common electrode 11 by two etching processes. This step comprises: after removing the second section 232 and part of the first section 231 by dry etching, removing the rest part of the first section 231 and the edge section 123 at the common electrode 11 by a dry etching process. Specifically, in the first process of etching for removing the second section 232 and part of the first section 231, which has the same thickness with the second section 232, the edge section 123 on the common electrode 11 is exposed, so that the thickness of the first section 231 is decreased. In the second process of etching the edge section 123 the rest part of the first section n231 at once, so that the common electrode is not damaged because of over etching.

Figure 8:
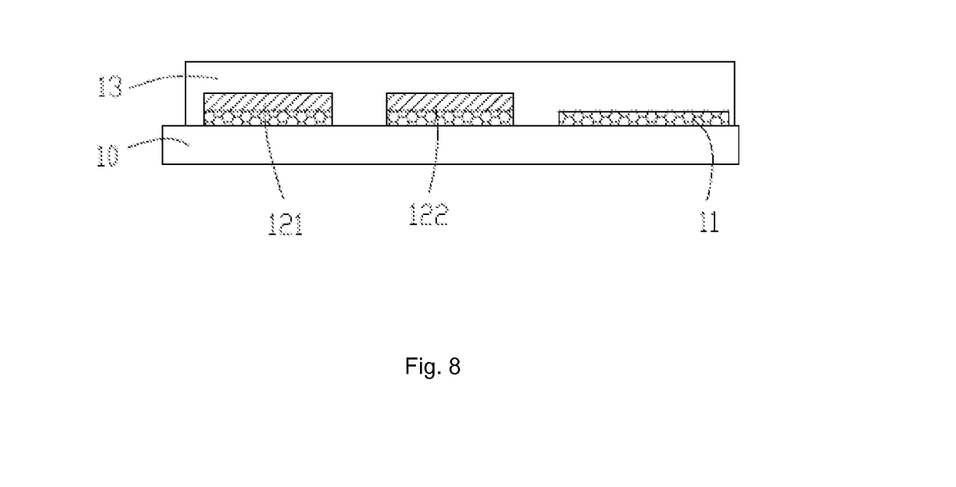

Please refer to FIG. 8, step S5, forming an insulating layer 13 on the light shielding layer 12 and the common electrode 11.

Figure 9:
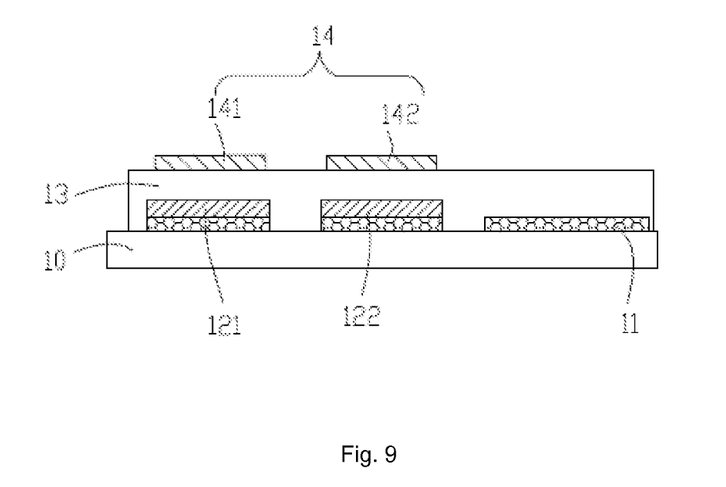

Please refer to FIG. 9, step S6, forming a patterned poly-silicon layer 14 on the insulating layer 13. Wherein the poly-silicon layer comprises a first poly-silicon section 141 and a second poly-silicon section 142. The orthographic projection of the first poly-silicon section 14 is at the first light shielding section 121, and the orthographic projection of the second poly-silicon layer 142 is at the second light shielding layer 122. The process of patterning in this step indicates the poly-silicon layer 14 formed by a second photomask process.

Figure 10:
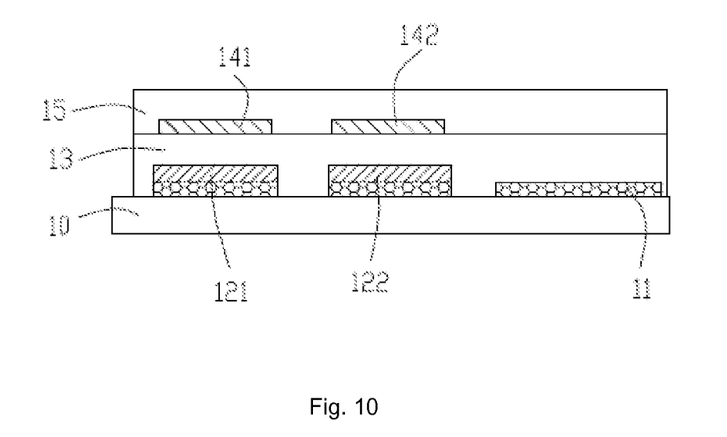

Please refer to FIG. 10, step S7, forming a gate insulating layer 15 on the poly-silicon layer 14 and the insulating layer 13, forming a hole 151 on the gate insulating layer 15 by a photomask and an etching process and defining a first doping section 145. Wherein the hole passes through the gate insulating layer 15 and the insulating layer 13 and the hole exposes the common electrode 11, and the first doping section 145 is disposed at the two lateral sides of the first poly-silicon section 141. In this step, the positions of the first doping section 145 and the hole are defined by a semi permeable membrane, and the hole 151 is formed by etching. The photomask indicates the third process of photomask.

Figure 11:
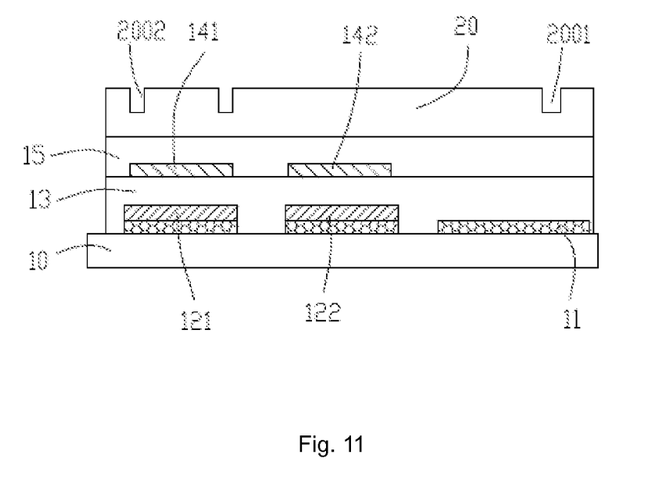

Please refer to FIG. 11, step S71, forming a photoresist layer on the gate insulating layer 15 and patterning the photoresist layer by a photomask, so that the patterned photoresist layer 20 comprises an electrode hole 2001 and two implanting holes 2002. The electrode hole 2001 is disposed right above the common electrode 11. The two implanting holes 2002 correspond to the two lateral sides of the first poly-silicon section 141.

Figure 12:
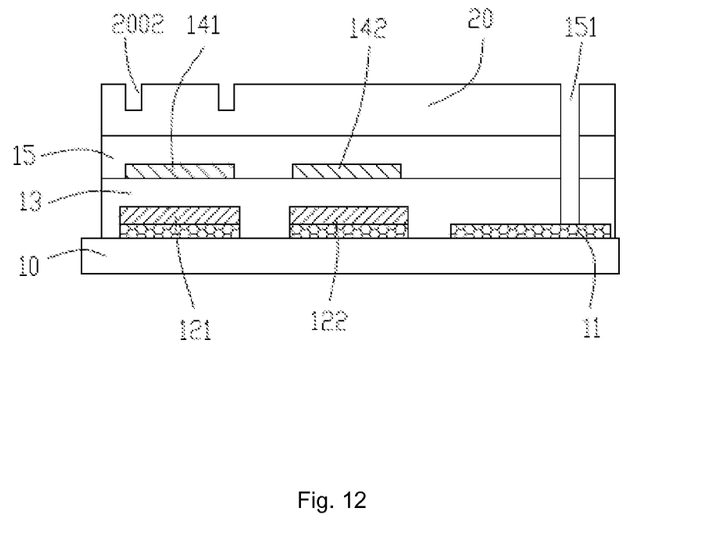

Please refer to FIG. 12, step S72, dry etching the gate insulating layer 15 and the insulating layer 13 corresponding to the electrode hole 2001 for forming the hole 151.

Figure 13:
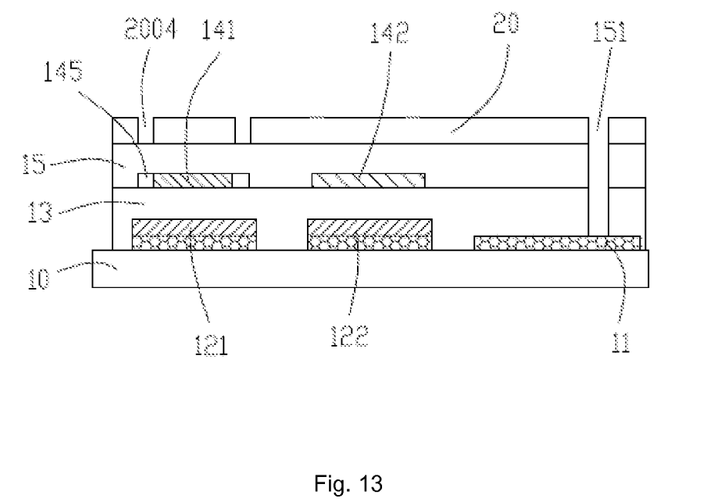

Please refer to FIG. 13, step S73, removing part of the photoresist layer 20 and penetrating the two implanting holes 2002 by etching for forming two implanting holes 2004 connecting with the gate insulating layer 15. The positions of the two implanting holes 2004 corresponding to the first doping section 145.

Figure 14:
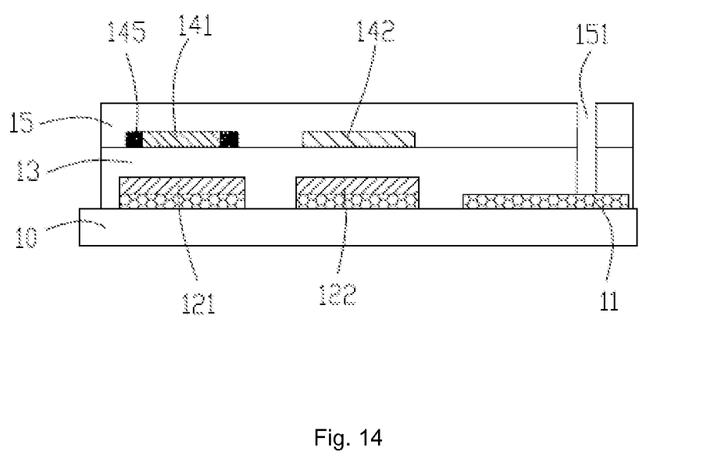

Please refer to FIG. 14, step S8, passing through the two implanting holes 2004, and injecting a first type ion to the first doping section 145; the first type ion is a P type ion or an N type ion. In this embodiment, the first type ion is a P type ion. This step further comprises step S81, removing patterned photoresist layer 20 by an etching process.

Figure 15:
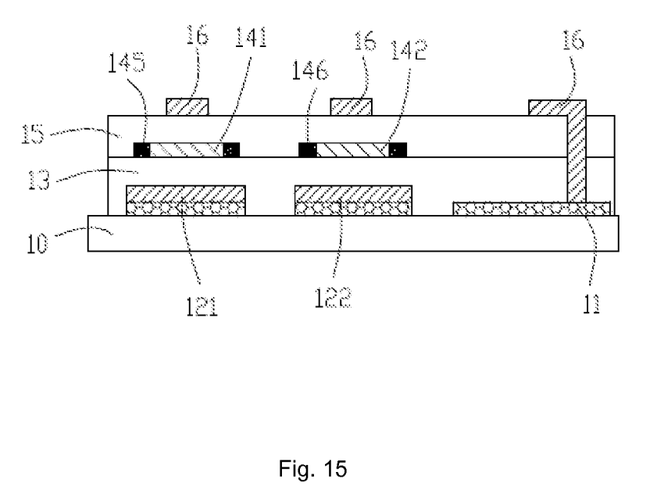

Please refer to FIG. 15, step S9, forming a second metallic layer (not shown) at the gate insulating layer 15, patterning the second metallic layer for forming a gate 16, and the gate 16 connecting with the common electrode 11 through the hole. In this embodiment, the patterned second metallic layer adopts a fourth process of photomask to form the gate. The hole is disposed at one side of the common electrode 11. The gate 16 comprises two parts having the orthographic projection to the first poly-silicon section 141 and the second poly-silicon section 142, respectively.

The method for manufacturing an array substrate further comprises:

Step S10, defining a second doping section 146. The second doping section 146 is disposes at the two lateral sides of the second poly-silicon section 142. Injecting a second type ion to the second doping section 146. The second type ion is an N type ion or a P type ion. In this embodiment, the first type ion is an N type ion. The process of defining the second doping section n146 can be done by present technique.

Figure 16:
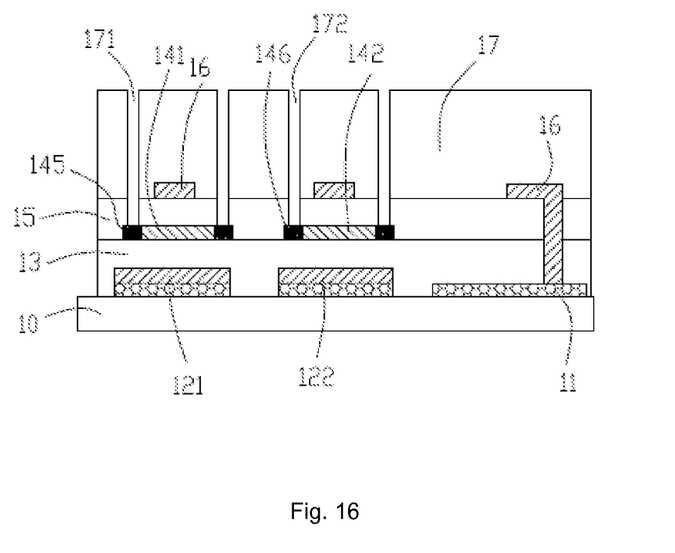

Please refer to FIG. 16, step S11, forming a medium layer 17 on the gate 16 and the gate insulating layer 15, and forming a source drain layer on the medium layer 17. This step further comprises forming a hole 171 connecting with the first doping section 145 and a hole 172 connecting with the second doping section 146 on the medium layer 17.

Figure 17:
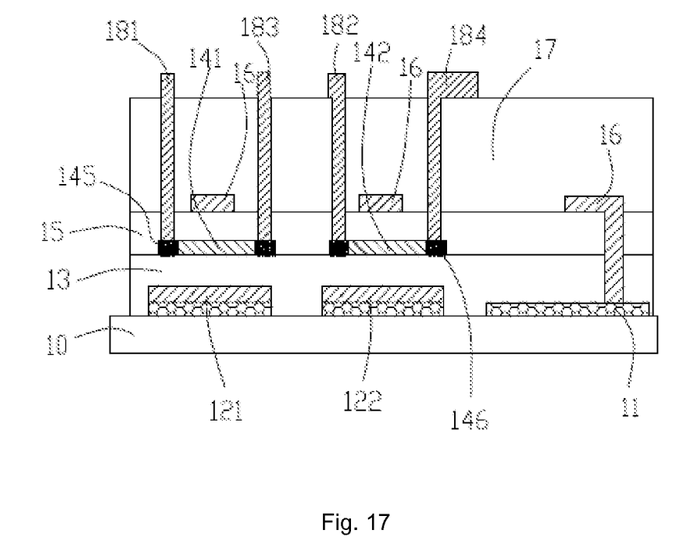

Please refer to FIG. 17, step S12, patterning the source drain layer by a photomask etching process for forming a source drain corresponding to the first poly-silicon section 141 and a source drain corresponding to the second poly-silicon section 142. The source drain connects with the first doping section 141 and the second doping section 142 by the hole. Specifically, the source drain is sources 181, 182, and drains 183, 184. The sources 181, 182 connect with the first doping section 145 by the hole 171. The drains 183, 184 connect with the second doping section 146 by the hole 172. The photomask in this step is the sixth photomask.

Please refer to FIG. 1 again, step S13, forming a patterned pixel layer 19 on the source drain and the medium layer 17. The manufactured array substrate is shown as FIG. 1. The process of patterning in this step is the seventh photomask process.

In this embodiment, the orthographic projection of the first light shielding section 121 and the first poly-silicon section 141 is at the gate of the first poly-silicon section 141, and the position of the first doping section 145 is PTFT. The orthographic projection of the second light shielding section 122 and the second poly-silicon section 142 is at the gate of the second poly-silicon section 142, and the position of the second doping section 146 is NTFT.

According to the embodiment of the disclosure, a method for manufacturing a thin film transistor is provided. One should realize that patterning indicates the process of patterning, including a lithographic process, or including a lithographic process and an etching process, it can also include other processes, such as stamping or ink jetting for forming a predetermined pattern; the lithographic process comprises the process using photoresist a mask, an exposure machine, such as filming, light exposing, developing. The process can be chosen according to the formed structure of the disclosure.

According to the embodiment of the disclosure, the method for manufacturing an array substrate comprises forming a transparent conductive layer and a first metallic layer on the substrate, then forming patterned common electrode and light shielding layer by multiple steps of etching, so that a process of photomask can be saved; then forming holes connecting with the common electrode 11 and the gate 16 by a photomask etching process, then manufacturing a medium layer and a source drain, so that a passivation layer is saved. The whole method adopts seven processes of photomask, so that the process of the array substrate tube is simplified, and the cost of manufacturing the array substrate is lowered.

According to the embodiment of the disclosure, the display units manufactured by the method for manufacturing thin film transistor can be, but not limited to, liquid crystal panels, liquid crystal TVs, liquid crystal displays, OLED panels, OLED TVs, e-papers, digital frames, mobile phones, and so forth.

Note that the specifications relating to the above embodiments should be construed as exemplary rather than as limitative of the present disclosure. The equivalent variations and modifications on the structures or the process by reference to the specification and the drawings of the disclosure, or application to the other relevant technology fields directly or indirectly should be construed similarly as falling within the protection scope of the disclosure.

What is claimed is:

1. A method for manufacturing an array substrate, the method comprising:
    providing a substrate, and forming a transparent conductive layer and a first metallic layer on the substrate in sequence;
    forming a photoresist layer on the first metallic layer, patterning the photoresist layer by a photomask, so that the patterned photoresist layer comprising two first sections and one second section, wherein a thickness of the two first sections is greater than a thickness of the second section;
    patterning the transparent conductive layer and the first metallic layer by two etching processes for forming a common electrode and a light shielding layer, wherein the light shielding layer comprises a first light shielding section, a second light shielding section and an edge section, the first light shielding section, the second light shielding section and the edge section are disposed apart by an interval in a same layer, an orthographic projection of the edge section is at the common electrode, an orthographic projection of the second section is at the edge section, and orthographic projections of the two first sections are at the first light shielding section and the second light shielding section;
    removing the patterned photoresist layer and the edge section on the common electrode by two etching processes;
    forming an insulating layer on the light shielding layer and the common electrode;
    forming a poly-silicon layer by patterning on the insulating layer, wherein the poly-silicon layer comprises a first poly-silicon section and a second poly-silicon section, an orthographic projection of the first poly-silicon section is at the first light shielding section, and an orthographic projection of the second poly-silicon layer is at the second light shielding layer;
    forming a gate insulating layer on the poly-silicon layer and the insulating layer, forming a hole on the gate insulating layer by a photomask and an etching process and defining a first doping section, wherein the hole passes through the gate insulating layer and the insulating layer and the hole exposes the common electrode, and the first doping section is disposed at two lateral sides of the first poly-silicon section;
    injecting a first type ion to the first doping section; and
    forming a second metallic layer at the gate insulating layer, patterning the second metallic layer for forming a gate, and the gate connecting with the common electrode through the hole.

2. The method for manufacturing an array substrate according to claim 1, wherein the method for manufacturing an array substrate further comprises: defining a second doping section and injecting a second ion to the second doping section, wherein the second doping section is disposed at two lateral sides of the second poly-silicon section;
    forming a medium layer on the gate and the gate insulating layer, and forming a source drain layer on the medium layer;
    patterning the source drain layer by a photomask etching process for forming a source drain corresponding to the first poly-silicon section and the source drain corresponding to the second poly-silicon section, wherein the source drain connects with the first doping section and the second doping section by the hole, respectively; and
    forming a patterned pixel layer on the source drain and the medium layer.

3. The method for manufacturing an array substrate according to claim 2, wherein patterning the transparent conductive layer and the first metallic layer by two etching processes for forming the common electrode and the light shielding layer comprises: etching the first metallic layer exposed between the two first sections and between one first section of the two first sections and the second section for forming the first light shielding section, the second light shielding section and the edge section of the light shielding layer; and wet etching the transparent conductive layer exposing from the light shielding layer for forming the common electrode.

4. The method for manufacturing an array substrate according to claim 3, wherein removing the light shielding layer and the edge section on the common electrode by an etching process comprises: after removing the second section and part of the first section by dry etching, removing rest part of the first section and the edge section at the common electrode by a dry etching process.

5. The method for manufacturing an array substrate according to claim 2, wherein forming the hole on the gate insulating layer by a photomask and an etching process and defining a first doping section comprises:
- forming the patterned photoresist layer on the gate insulating layer by a semipermeable membrane photomask for forming an electrode hole and two implanting holes;
- dry etching the gate insulating layer and the insulating layer corresponding to the electrode hole for forming the hole; and
- removing part of the photoresist layer and penetrating the two implanting holes by etching for forming the two implanting holes connecting with the gate insulating layer, and positions of the two implanting holes corresponding to the first doping section.

6. The method for manufacturing an array substrate according to claim 5, wherein the first type ion is a P type ion, the second type ion is a N type ion, alternatively, the second type ion is a P type ion, and the first type ion is a N type ion.

* * * * *